(12) United States Patent
Kocon

(10) Patent No.: US 11,177,253 B2
(45) Date of Patent: Nov. 16, 2021

(54) TRANSISTOR WITH INTEGRATED CAPACITOR

(71) Applicant: Texas Instruments Incorporated, Dallas, TX (US)

(72) Inventor: Christopher Boguslaw Kocon, Mountain Top, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/185,657

(22) Filed: Nov. 9, 2018

(65) Prior Publication Data

US 2020/0152623 A1 May 14, 2020

(51) Int. Cl.
| | | |
|---|---|---|
| H01L 27/06 | (2006.01) | |
| H01L 23/522 | (2006.01) | |
| H01L 21/822 | (2006.01) | |
| H02M 3/158 | (2006.01) | |
| H01L 29/06 | (2006.01) | |
| H01L 23/532 | (2006.01) | |
| H01L 29/78 | (2006.01) | |

(52) U.S. Cl.
CPC ...... *H01L 27/0688* (2013.01); *H01L 21/8221* (2013.01); *H01L 23/5223* (2013.01); *H01L 23/5226* (2013.01); *H01L 23/53214* (2013.01); *H01L 23/53228* (2013.01); *H01L 23/53257* (2013.01); *H01L 29/0696* (2013.01); *H01L 29/7816* (2013.01); *H02M 3/158* (2013.01)

(58) Field of Classification Search
CPC ............. H01L 23/5223; H01L 21/8221; H01L 23/5226; H01L 23/53214; H01L 23/53228; H01L 23/53257; H01L 27/0629; H01L 27/0688; H01L 29/0696; H01L 29/0847; H01L 29/7816; H01L 29/7835

See application file for complete search history.

(56) References Cited

U.S. PATENT DOCUMENTS

| | | | | |
|---|---|---|---|---|
| 6,022,791 | A | * | 2/2000 | Cook ..................... H01L 23/585 |
| | | | | 438/458 |
| 6,218,197 | B1 | * | 4/2001 | Kasai ..................... H01L 27/105 |
| | | | | 438/3 |
| 6,518,173 | B1 | * | 2/2003 | Chan ................. H01L 21/31111 |
| | | | | 257/E21.251 |
| 7,589,378 | B2 | | 9/2009 | Kocon et al. |
| 8,288,820 | B2 | | 10/2012 | Kocon et al. |
| 8,748,976 | B1 | | 6/2014 | Kocon et al. |
| 8,928,075 | B2 | | 1/2015 | Kocon et al. |
| 9,230,851 | B2 | | 1/2016 | Molloy et al. |
| 9,299,830 | B1 | | 3/2016 | Kawahara et al. |
| 9,318,598 | B2 | | 5/2016 | Grebs et al. |
| 9,496,388 | B2 | | 11/2016 | Grebs et al. |
| 9,583,611 | B2 | | 2/2017 | Grebs et al. |

(Continued)

*Primary Examiner* — Nongsavanh Sengdara
(74) *Attorney, Agent, or Firm* — Andrew R. Ralston; Charles A. Brill; Frank D. Cimino

(57) ABSTRACT

An electronic device includes a MOS transistor with a source and a drain, and a capacitor with a first plate connected directly to the source, and a second plate connected directly to the drain. A method to fabricate an electronic device includes fabricating a MOS transistor on or in a semiconductor structure, and fabricating a capacitor having a first plate connected directly to a source of the MOS transistor, and a second plate connected directly to a drain of the MOS transistor.

22 Claims, 12 Drawing Sheets

(56) References Cited

U.S. PATENT DOCUMENTS

| | | | |
|---|---|---|---|
| 9,711,639 B2 | 6/2017 | Kawahara et al. | |
| 9,905,428 B2 | 2/2018 | Strachan et al. | |
| 2001/0013614 A1* | 8/2001 | Joshi | H01L 27/11502 |
| | | | 257/295 |
| 2005/0224982 A1* | 10/2005 | Kemerling | H01L 27/11807 |
| | | | 257/758 |
| 2007/0090447 A1* | 4/2007 | Morimoto | H01L 23/585 |
| | | | 257/316 |
| 2013/0093048 A1* | 4/2013 | Chang | H01L 27/10808 |
| | | | 257/532 |
| 2015/0060778 A1* | 3/2015 | Kim | H01L 27/3258 |
| | | | 257/40 |
| 2015/0145101 A1* | 5/2015 | Hsu | H01L 28/91 |
| | | | 257/532 |
| 2015/0349112 A1 | 12/2015 | Grebs et al. | |
| 2016/0133713 A1* | 5/2016 | Gutman | H01L 21/76829 |
| | | | 257/66 |
| 2016/0240653 A1 | 8/2016 | Kocon et al. | |
| 2017/0025525 A1 | 1/2017 | Kocon et al. | |
| 2017/0062573 A1 | 3/2017 | Kocon et al. | |
| 2017/0222041 A1 | 8/2017 | Kawahara et al. | |
| 2017/0288052 A1 | 10/2017 | Kawahara et al. | |
| 2018/0226502 A1 | 9/2018 | Kawahara et al. | |

* cited by examiner

TRANSISTOR WITH INTEGRATED CAPACITOR

BACKGROUND

High efficiency power supplies are desirable for battery-operated systems, including mobile phones, tablets, laptops and other user devices. Increased power density reduces circuit size, and lowered costs are desired properties of switching converters for many such applications. Many DC to DC converter topologies, such as buck, boost, buck-boost, cuk and other configurations, use high and low side transistor switches or drivers to alternately connect a switching node to the input voltage or ground. Switching converter efficiency is largely influenced by switching losses and conduction losses. High and low side drivers are typically sized to withstand the input voltage level and to provide low on-state resistance (e.g., RDSON). In general, increased power density is facilitated by increased switching frequency. The operating frequency is limited by ringing, including transient voltage and/or current swings in response to the converter switch is turning on and off. Switching losses can be reduced by zero voltage switching (ZVS) and/or zero current switching (ZCS), in which the high and low side transistors are turned on and/or off when the corresponding switch voltage or current is at or near zero. In order to achieve at or near ZVS or ZCS operation, the switching transition must wait until the voltage and/or current ringing is attenuated. Reduced circuit ringing enhances efficiency and allows use of lower voltage rated, better figure of merit (FOM) transistors, such as laterally diffused metal oxide semiconductor (LDMOS) devices, thereby facilitating improved power density. Ringing can be controlled using snubber circuits. However, ringing is influenced by circuit inductances, which are difficult to control. The addition of external snubber circuits introduces additional inductances in a switching power circuit, and may lead to non-ideal switching waveforms.

SUMMARY

Described examples include methods, integrated circuits, and electronic devices including drain-extended transistors. The described example electronic device includes a MOS transistor, such as a drain-extended MOS (DEMOS) transistor, with a source and a drain. The electronic device includes an integrated capacitor with a first interconnect structure connected directly to the source, and a second interconnect structure connected directly to the drain. An example method is disclosed for fabricating an electronic device. The method includes fabricating a MOS transistor on or in a semiconductor structure, and fabricating a capacitor having a first interconnect structure connected directly to a source of the MOS transistor, and a second interconnect structure connected directly to a drain of the MOS transistor.

DETAILED DESCRIPTION

Figure 1:
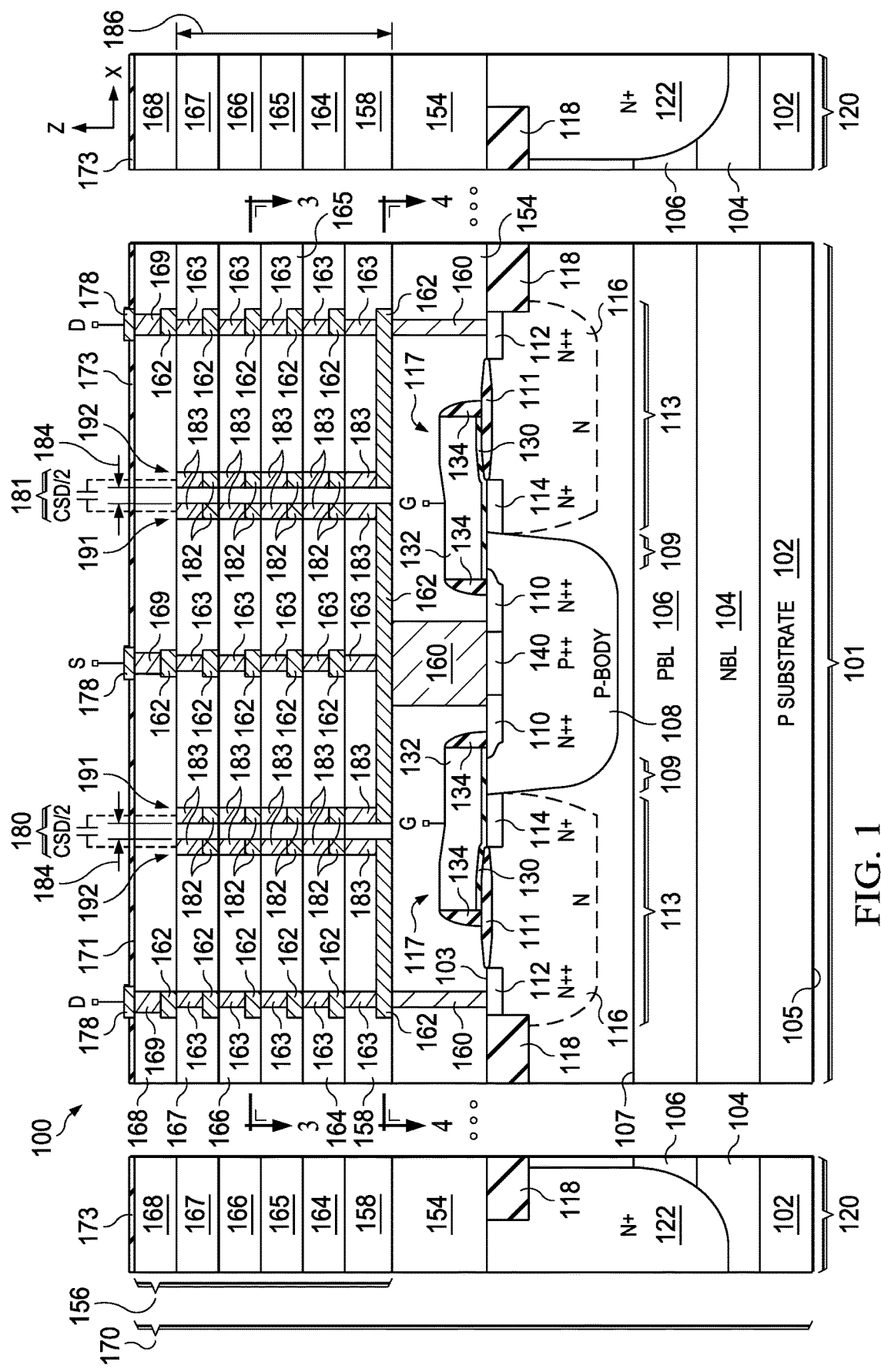
FIG. 1 is a partial sectional side elevation view of an integrated circuit including a drain-extended transistor with an integrated drain-source capacitor with capacitor interconnect structures formed in multiple metallization layers above a PMD layer.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections. As used herein, direct connection or "connected directly to", includes contacting electrical connections between conductive structures or features in an integrated circuit or other electronic device, as well as electrical connections to such conductive structures or features through intervening metallic conductor structures (e.g., tungsten, aluminum, copper, etc.) within the electronic device, as distinct from electrically conductive connection to such conductive structures or features external to, or outside of, the electronic device. As used herein, "directly connected" and similar phrases with respect to capacitor plate structures and interconnection to source or drain structures of a transistor mean no more than one 90 degree change of direction of the signal path between the capacitor plate or capacitive interconnect structure and the source/drain. In certain examples, this includes a connection between a capacitor terminal or interconnect structure and a device (e.g., transistor) terminal that includes no more than one straight horizontal portion (e.g., with no 90 degree jogs), and one straight vertical (e.g., via and/or contact) portion, allowing for multiple instances of such structures arranged in parallel. The various features of the disclosed examples can be used in connection with a variety of different electronic devices, including without limitation integrated circuits having multiple electronic components, as well as single component electronic devices (e.g., single transistor products, single diode products, etc.).

Figure 2:
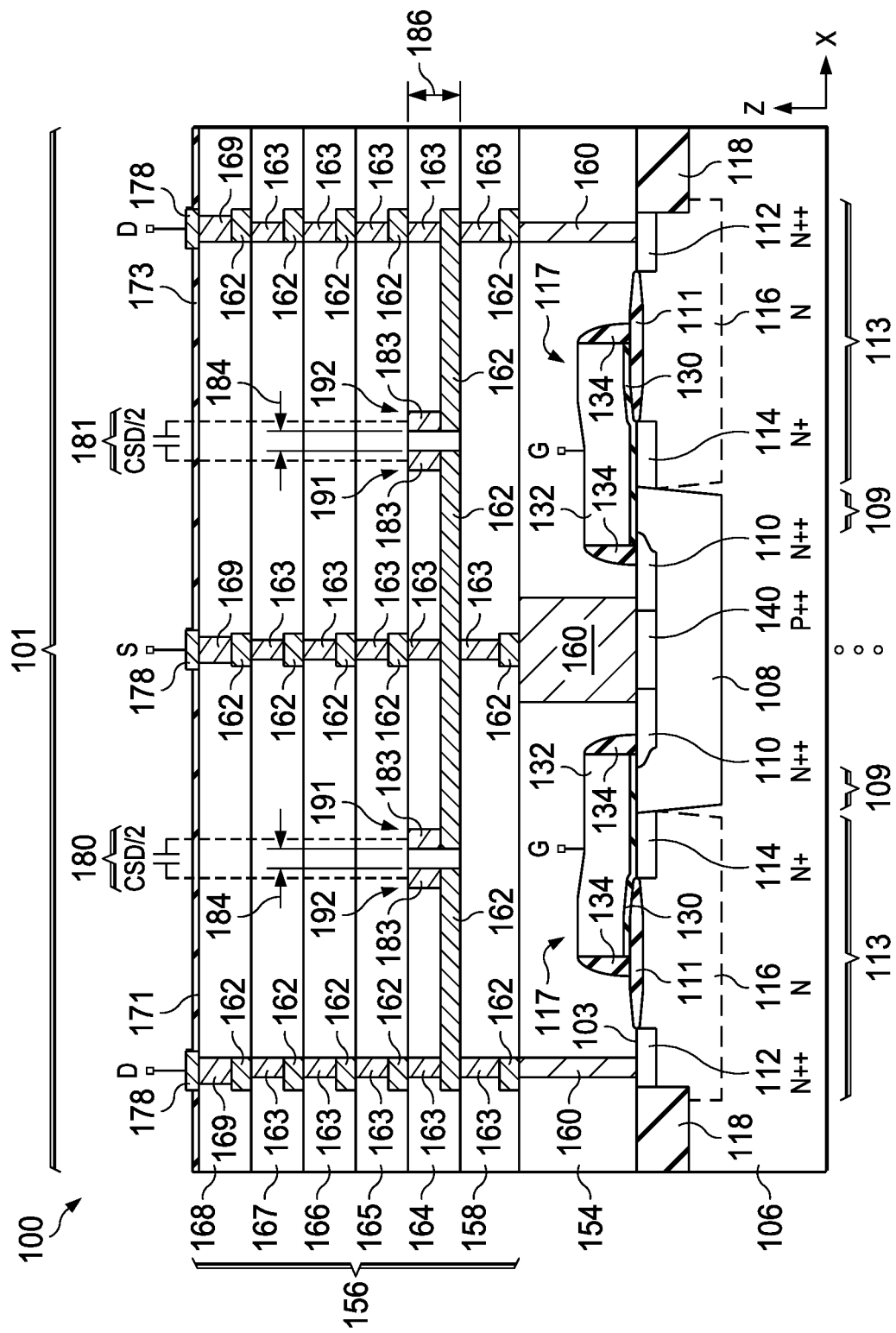
FIG. 2 is a partial sectional side elevation view of another example of the integrated circuit with a drain-extended transistor and an integrated drain-source capacitor with capacitor interconnect structures formed in a first upper metallization layers above a PMD layer.
Figure 3:
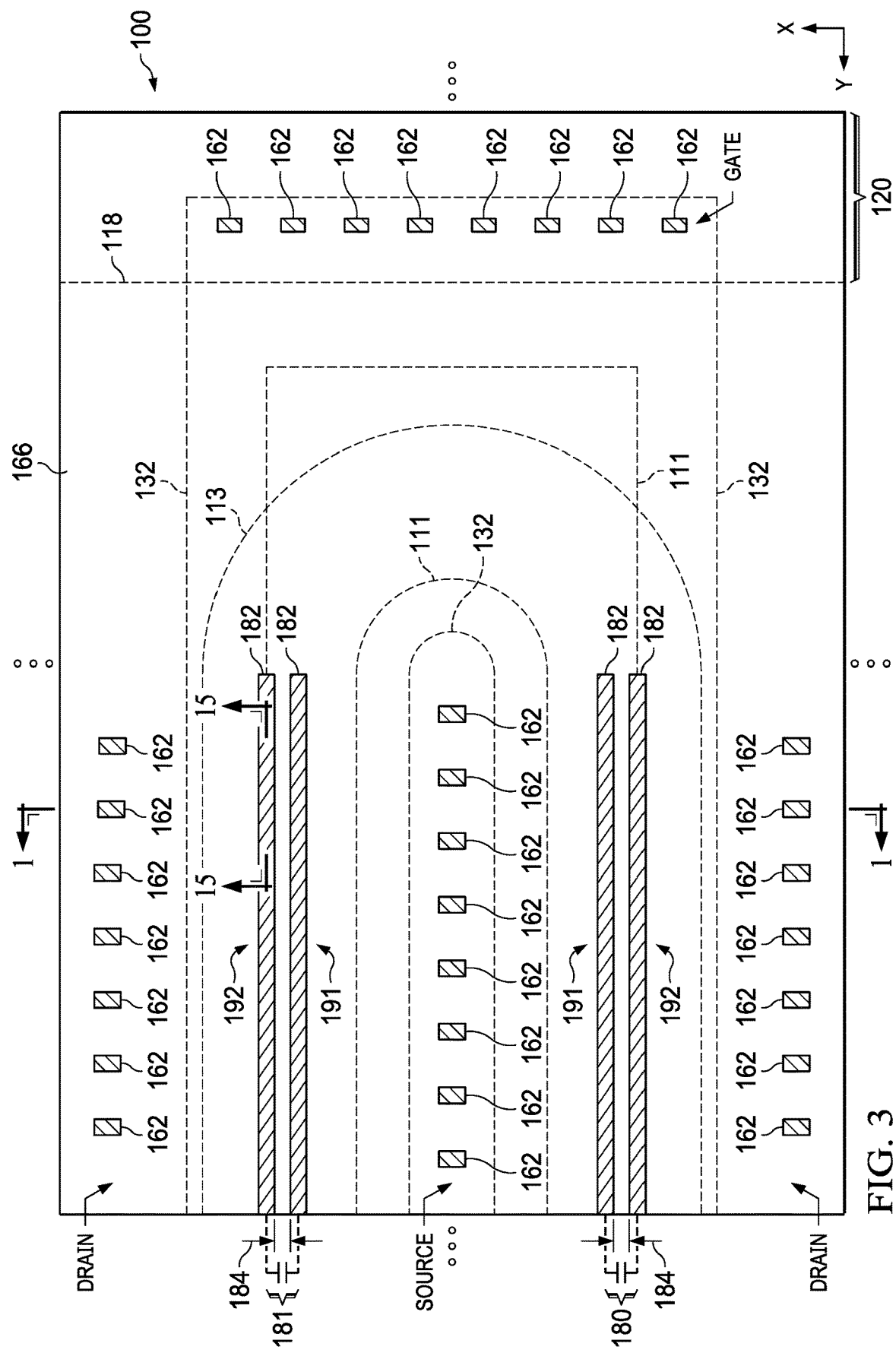
FIG. 3 is a partial sectional top plan view of the integrated circuit along line 3-3 of FIG. 1 with capacitor interconnect structures extending parallel to a transistor finger direction.
Figure 4:
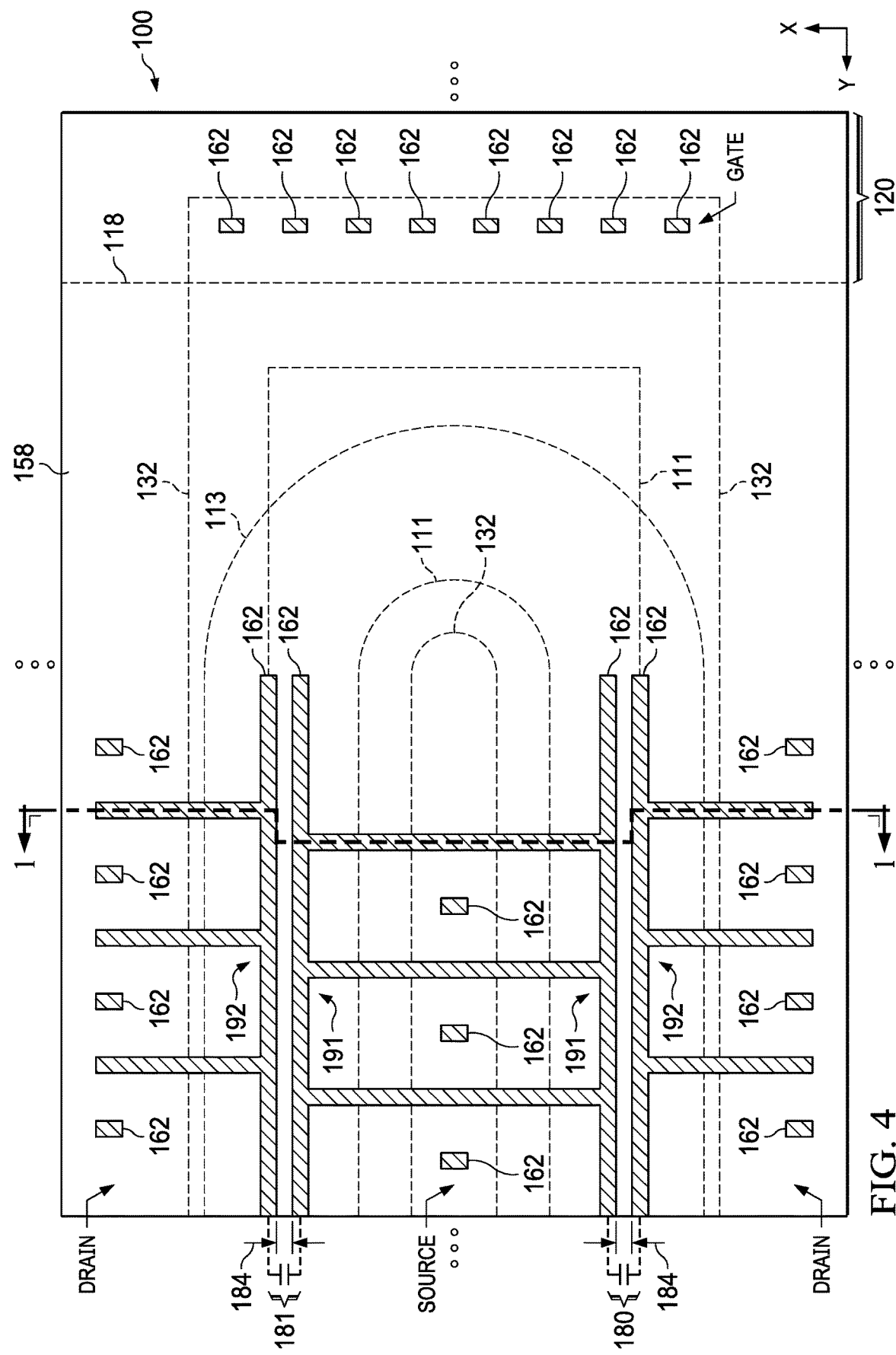
FIG. 4 is a partial sectional top plan view of the integrated circuit along line 4-4 of FIG. 1.

Referring initially to FIGS. 1-4, FIG. 1 shows an example integrated circuit (IC) or electronic device 100 that includes a drain-extended MOS (DEMOS) transistor 101 with an integrated drain-source capacitor. Disclosed examples provide solutions that may enhance efficiency and power density for switching power converters and other circuit applications through integrated capacitors directly connected to switching transistors. In certain applications, the integrated capacitor provides a low inductance, low equivalent series resistance snubber circuit to facilitate reduced ringing peak voltages and currents, and shortened settling time following switch state transitions in switching converter circuits or other applications, particularly compared to solutions using external snubber circuitry. In this manner, the disclosed examples facilitate increased operating frequency to increase power density and improve circuit efficiency. FIGS. 3 and 4 show top sectional plan views of the IC 100 of FIG. 1 taken respectively along lines 3-3 and 4-4 of FIG. 1. The transistor 101 in FIG. 1 includes interconnect structures that may operate as capacitor plates in multiple metallization layers above a pre-metal (PMD) layer of the integrated circuit 100. FIG. 2 is a partial sectional side elevation view of another example of the integrated circuit 100 where the transistor 101 includes an integrated drain-source capacitor with capacitor plates formed in a single, first upper metallization layer above the PMD layer.

The integration of a drain-source capacitor can be used in electronic devices having a single transistor, or in IC implementations that include multiple electronic components. The disclosed examples, moreover, can be implemented in combination with a variety of types or forms of transistor, such as MOS transistors. In addition, various aspects of the disclosed examples provide benefits in combination with drain-extended MOS transistors, although not a requirement of all possible implementations. Drain-extended transistors can include drain-extended NMOS (DENMOS), drain-extended PMOS (DEPMOS), and/or laterally diffused MOS (LDMOS) transistors, as well as groups of DENMOS and DEPMOS, referred to as complimentary drain-extended MOS or DECMOS transistors. Described examples include doped regions of various semiconductor structures which may be characterized as p-doped and/or n-doped regions or portions, and include regions that have majority carrier dopants of a particular type, such as n-type dopants or p-type dopants. The illustrated transistor 101 is an n-channel drain-extended transistor (e.g., DENMOS). Other implementations are possible within the scope of the present disclosure, including p-channel drain-extended transistor examples (e.g., DEPMOS) using oppositely doped structures and regions.

The example drain-extended MOS transistor 101 is fabricated on and/or in a semiconductor substrate 102. The semiconductor substrate 102 in one example is a silicon wafer, a silicon-on-insulator (SOI) substrate or other semiconductor structure. In one example, the substrate 102 is a p-doped silicon substrate or wafer, with a first (e.g., top) side 103, various buried layers formed therein, and a second (e.g., bottom) side 105. In another possible implementation, the substrate 102 includes one or more epitaxial silicon layers formed on a top surface, with one or more of the buried layers formed in the substrate. The illustrated substrate 102 includes a first doped layer 106 that includes p-type majority carrier dopants, thus referred to as a p-type layer 106. In one implementation, the p-type layer 106 includes a portion implanted with boron to form a p-type buried layer (PBL) with an upper or top side 107, and a further portion, e.g. a lightly-doped p-type epitaxial layer, that extends over (e.g., directly on) the PBL to form the first side 103.

The example substrate also includes a second doped layer 104 (e.g., an n-type buried layer, sometimes referred to as NBL 104) that includes n-type majority carrier dopants. The second doped layer 104 extends along a first direction (e.g., the vertical −Z direction in FIG. 1) from beneath the p-type layer 106 toward the second side 105. In one example, a first epitaxial silicon layer is formed over the upper surface of a silicon wafer, and all or a portion of the first epitaxial layer is implanted with n-type dopants (e.g., phosphorus, etc.) to form the n-type buried layer. In this example, a second epitaxial silicon layer is formed over the first epitaxial layer, and all or a portion of the second epitaxial layer is implanted with p-type dopants (e.g., boron, etc.) to form the p-type buried layer with the top side 107. In one example, the PBL region is formed using ion implantation through the final silicon surface (e.g., the top of the second epitaxial layer), with a depth set by using a high implantation energy.

The example transistor 101 is an n-channel device with a source-centered finger configuration. In other examples, a p-channel drain-extended transistor (e.g., a DEPMOS) can be constructed, having oppositely doped structures and regions. The example transistor 101 includes a body region 108 having p-type majority carrier dopants (e.g., referred to as a P-BODY). The body region 108 extends along the −Z direction into the p-type layer 106 from the first side 103. The body region 108 includes a channel portion 109 on either side of the center source. The individual channel portions 109 extend to the first side 103 of the substrate 102. The transistor 101 also includes a source region 110 (sometimes referred to as a source 110) that extends along the −Z direction into the p-type layer 106 from the first side 103. The source region 110 extends laterally along orthogonal second directions (e.g., the ±X directions in FIG. 1) adjacent a first (e.g., inner) side of each of the channel portions 109 of the body region 108. The source region 110 in the illustrated n-channel transistor includes n-type majority carrier dopants (e.g., labeled N++ in the drawings).

The transistor 101 in FIG. 1 has an extended drain structure that includes an oxide structure 111 (e.g., field oxide) that extends along the first side 103 to provide a field gap for a laterally diffused extended drain. The example source-centered transistor 101 includes gate structures 117 (sometimes referred to as a gate 117) and drain regions 112

(sometimes referred to as a drain 112), respectively, that extend laterally around the source region 110, although not a requirement of all possible implementations. The oxide structure 111 laterally encircles the source region 110. The oxide structure 111 on each lateral side includes a first edge (e.g., an inner edge) spaced apart along the X direction from the channel portion 109 of the body region 108, as well as a second (e.g., outer) edge that extends outward toward the drain region 112 (referred to as a drain). The drain regions 112 extend downward in FIG. 1 along the −Z direction into the p-type layer 106 from the first side 103. The individual drain regions 112 each have a first end adjacent the second end of the oxide structure 111 and include n-type majority carrier dopants (e.g., labeled N++ in the drawings). In the illustrated example, the oxide structure 111 is a local oxidation of silicon (LOCOS) structure.

The extended drain structure includes a drift region 113 with a highly doped first drift region portion 114 (e.g., connection portion, labeled N+ in the drawings) with n-type majority carrier dopants of a first dopant concentration. The first drift region portion 114 extends along the −Z direction into the p-type layer 106 from the first side 103, and extends laterally along the X direction from the channel portion 109 of the body region 108 to the first edge of the oxide structure 111. In certain examples, the dopant concentration of the first drift region portion 114, and concentrations of other regions in the IC 100, can be profiled and can vary within a range. In the illustrated example, the drift region 113 also includes a second drift region portion 116 (e.g., labeled N in the drawings) that includes n-type majority carrier dopants of a second dopant concentration less than the first dopant concentration. The individual second drift region portions 116 extend laterally between the corresponding first drift region portion 114 and the corresponding drain region 112. In one example, all or at least a portion of the oxide structure 111 extends between the second drift region portion 116 and the first side 103 along the Z axis.

The example gate structures 117 extend at least partially over the corresponding channel portions 109 of the body region 108. The illustrated IC 100 further includes isolation features, including an outer oxide structure 118, e.g. an isolation structure, that encircles the transistor 101 along the first (e.g., top) side 103. The oxide structure 118 in one example is a shallow trench isolation (STI) structure, which is disposed laterally outward of the outermost drain regions 112. In the illustrated example, the oxide structure 118 defines an end of an active region of the semiconductor substrate 102 in which the transistor 101 is formed. The oxide structure 118 in one example is adjacent to an isolation structure 120 that encircles or surrounds the transistor 101 and the active region of the IC 100. The isolation structure 120 includes a deep n-doped region 122 (e.g., labeled N+ in FIG. 1) that extends laterally outward of the active region.

In another implementation, an isolation structure can be implemented using a deep trench structure with doped sidewall structures (not shown) that extend from the first side 103 of the substrate 102 through the p-type layer 106, and into the NBL layer 104. In certain examples, the isolation structure includes sidewall structures (not shown) on opposite lateral sides of deposited field oxide structures (not shown) that extend into the lower portion of the p substrate 102 beneath the NBL layer 104.

As seen in FIGS. 1, 3 and 4, the example transistor 101 includes finger structures that extend along a finger direction (e.g., along the Y direction in FIGS. 3 and 4), in which the gate structure 117 laterally encircles the source region 110. The illustrated gate structure 117 includes a gate dielectric layer 130 formed over the first side 103 of the substrate 102, a patterned gate electrode 132 (e.g., polysilicon) on the gate dielectric layer 130, and lateral sidewall spacers 134 along lateral sides of the patterned gate electrode 132. The gate structure 117 provides an effective channel length (Leff) of the drain-extended transistor 101 from a first end of the gate electrode 132 to an inner side of the channel portion 109 along the X axis. The example transistor 101 also includes a p-type body contact region 140 laterally adjacent to the source region 110 to provide an electrical connection to the body region 108 (labeled P++ in FIG. 1).

The IC 100 also includes a metallization structure with a first dielectric structure layer 154 formed over the substrate 102, as well as a multi-level upper metallization structure 156. In one example, the first dielectric structure layer 154 is a pre-metal dielectric (PMD) layer disposed over the transistor 101 and the upper surface of the substrate 102. For brevity the first dielectric structure layer 154 may be referred to as the PMD layer 154. In one example, the PMD layer 154 includes silicon dioxide ($SiO_2$) deposited over the transistor 101, the substrate 102 and the oxide structures 118. The PMD layer 154 includes contacts 160 that provide direct electrical connection to one or more features of the transistor 101. The PMD layer 154 and the upper metallization structure 156 cover the transistor 101 and provides internal and/or external electrical interconnection to the transistor source, drain and gate terminals, respectively designated S, D and G in FIG. 1. The PMD layer 154 is formed over the illustrated structure, with contacts 160 formed therein to provide electrical interconnection access for one or more further upper metallization layers 158 and 164-168. As used herein, the source, drain and gate contact features of the transistor include associated silicide (e.g., $CoSi_2$) or other conductive surface features that provide electrical connection to the associated source regions 110, drain regions 112, and gate electrodes 132. In one example, a silicide (not shown) is formed over the top surfaces of the source regions 110, the drain regions 112, and the gate electrodes 132. The PMD layer contacts 160 in one example are tungsten contact plugs that directly contact the silicide of the associated features and regions of the transistor 101.

The upper metallization structure 156 includes one or more layers. In one example, the upper metallization structure 156 includes one or more conductive structures or features that are directly connected to the source region 110 or the drain region 112 to form an integrated capacitor between the source region 110 and the drain region 112. In the illustrated example, the upper metallization structure 156 includes the first metallization layer 158 formed over the PMD layer 154, as well as the further metallization layers 164, 165, 166, 167, and 168 progressively formed over the preceding layer as shown in FIG. 1. The IC 100 in FIG. 1 is shown as a wafer 170 prior to singulation and packaging, but the illustrated structure represents the described features after being separated as a die for packaging. Although the example die 170 is an integrated circuit with multiple components, such as transistors 101 for a switching DC-DC converter chip, other microelectronic device implementations can include a single transistor or other electronic component.

The example die 170 of FIG. 1 includes a six layer upper metallization structure 156 with the first metallization layer 158, sometimes referred to herein as a first interlayer or interlevel dielectric (ILD) layer. Different numbers of layers can be used in different implementations. In one example, the first ILD layer 158, and the other ILD layers of the upper metallization structure 156 are formed of silicon dioxide (SiO$_2$) or other suitable dielectric material. In certain implementations, the individual layers of the multi-layer upper metallization structure 156 are formed in two stages, including an intra-metal dielectric (IMD, not shown) sub-layer with conductive metal routing features or line segments 162 (e.g., aluminum, copper, etc.), and an ILD sublayer overlying the IMD sub layer with conductive vias 163 (e.g., tungsten or copper). The individual IMD and ILD sublayers can be formed of any suitable dielectric material or materials, such as SiO$_2$-based dielectric materials. Tungsten or other conductive contacts 160 extend through selected portions of the PMD layer 154 to make direct contact with the source 110 or the drain region 112 (e.g., including any silicide thereof).

The first ILD layer 158, and the subsequent layers in the upper metallization structure 156 include line segments 162 formed on the top surface of the underlying layer. In this example, the first ILD layer 158 and the subsequent ILD layers also include conductive vias 163, providing electrical connection from the line segments 162 of an individual layer to an overlying metallization layer. The example of FIG. 1 includes a second metallization or ILD layer 164 disposed over the first ILD layer 158. The first ILD layer 158 includes line segments 162 and vias 163. The line segments 162 and vias 163 can be the same metal or different metals in various implementations. The individual layers can be constructed using any suitable metallization fabrication processing, such as single damascene or dual damascene processes. The illustrated structure includes further metallization layers 165, 166 and 167, with corresponding ILD layers, as well as an uppermost or top metallization layer 168. The individual metallization layers 165-168 in this example include line segments 162 and associated vias 163. The substrate 102, the electronic components (e.g., the transistor 101), the PMD layer 154 and the upper metallization structure 156 form a wafer or die 170 with an upper side or surface 171. The upper side 171 of the upper metallization structure 156 in one example forms an upper side of the wafer or die 170.

The top metallization layer 168 includes two example conductive features 169, such as uppermost aluminum vias. The conductive features 169 include a side or surface at the upper side 171 of the wafer or IC die 170 at the top of the uppermost metallization layer 168. Any number of conductive features 169 may be provided. One or more of the conductive features 169 can be electrically coupled with an electronic component such as a transistor 101. The top metallization layer 168 in one example is covered by one or more passivation layers 173 (e.g., protective overcoat (PO) and/or passivation layers), for example, silicon nitride (SiN), silicon oxynitride (SiO$_x$N$_y$), or silicon dioxide (SiO$_2$). In one example, the passivation layer or layers 173 include one or more openings that expose a portion of the conductive features 169 to allow electrical connection of the features 169 to corresponding contact structures. The example wafer or die 170 includes multiple conductive contact structures 178, including connections for the transistor source S and drain D. The contact structures 178 extend outward (e.g., upward along the "Z" direction in FIG. 1) from the upper side 171 of the upper metallization structure 168. The individual contact structures 178 are electrically coupled with a corresponding one of the conductive features 169. The individual contact structures 178 in one example include a conductive seed layer, such as copper that extends outward from the upper side 171 of the upper metallization structure 168. In one example, the contact structure 178 includes titanium (Ti) or titanium tungsten (TiW), e.g. as a barrier layer.

The IC 100 includes an integrated source-drain capacitor 180, 181 having a source-drain capacitance CSD. The capacitor 180, 181 includes a first plate 191 connected directly to the source region 110, and a second plate 192 connected directly to the drain region 112. In the illustrated portion shown in FIG. 1, the capacitor includes a first portion 180 with a capacitance CSD/2 connected between the source S and the leftmost drain structure D, as well as a second portion 181 with a capacitance CSD/2 connected between the source S and the rightmost drain structure D in the figure. Although illustrated with two separate portions 180 and 181, other examples are possible having a single capacitor portion, or more than two capacitor portions may be provided. For example, the transistor 101 may include several finger structures, and several corresponding source and drain fingers, and capacitor portions can be constructed with capacitor plates connected to corresponding source or drain fingers to form a capacitor having multiple, parallel-connected, capacitor portions.

In the example of FIG. 1, the individual capacitor portions 180 and 181 include conductive line segments 182 formed contemporaneously with the line segments 162, as well as vias 183 formed contemporaneously with the vias 163 of the corresponding metallization layer. The line segments 182 and vias 183 in the metallization layers 158 and 164-167 are directly in contact with one another in the individual metallization layers. The line segments 182 and vias 183 form a continuous directly electrically connected plate structure, e.g., a mesh or grid of metal lines and vias. The plate structure includes a conductive first capacitor plate 191 that is connected directly to the source region 110, and a conductive second capacitor plate 192 connected directly to the drain region 112. In the example of FIG. 1, the first plate 191 is spaced laterally (along the X axis) from the corresponding second plate 192 by a gap distance 184, which can be tailored for a given capacitor design. In addition, the capacitor plates 191 and 192 have a vertical height or extent 186 along the Z axis in the drawings. The dielectric material of the metallization layers 158, 164-167 provides a dielectric material with a thickness equal to the gap distance 184 between the generally parallel plates 191 and 192. It may be generally preferable that the gap distance 184 be no greater than the minimum distance supported by the manufacturing process. In some cases the minimum distance may be less than 1 μm, and in some such cases may be less than about 0.5 μm. Furthermore, in some cases the gap distance 184 may be different at different metal levels, for example as when a minimum space design rule is different at different metal levels.

The individual first plates 191 in FIG. 1 are connected directly to the line segments 162, vias 163 and the contact 160 of the source S by a line segment 162 of the first ILD layer 158. The source contact 160, in turn, is in direct contact with the source regions 110 (including any silicide or other conductive feature thereof). In this example, the individual second plates 192 are connected directly to the lines segments 162 and vias 163 and the contact 160 of the corresponding drain D by corresponding line segments 162 of the first ILD layer 158. In this manner, the first plate 191 is connected directly to the source region 110 and the second plate 192 is connected directly to the drain region 112. This forms the integrated source-drain capacitor for the transistor 101. In this example, the direct metal connection of the capacitor plates 191 and 192 with the metallization conductive routing features associated with the source S and the drain D provide a composite plate structure that directly connects the plates 191, 192 with a corresponding source region 110 and drain region 112. In this example, moreover, the first and second plates 191, 192 include tungsten.

FIG. 2 shows a simplified side view of another example of the integrated circuit 100 with a drain-extended transistor 101 as described above, and an integrated drain-source capacitor 180, 181. In this example, the capacitor plates 191 and 192 are formed in a first ILD layer 158 above the PMD layer 154. As discussed above, the capacitor plate spacing 184 can be tailored for a given capacitor design. In addition, or in combination, the vertical (e.g., Z direction) height or extent 186 of the capacitor plates can be adjusted by selectively creating capacitor plate line segments 182 and vias 183 in a selected number of metallization layers to set the capacitance CSD. Where a single metallization layer is used to form the capacitor plates 191 and 192, different designs can use different metallization layers for the capacitor plate structures. Moreover, although the capacitor plate structures are connected or routed to the corresponding metallization features of the source region 110 or the drain region 112 on a single metallization layer in the examples of FIGS. 1 and 2, the interconnections can be provided on more than one layer in certain examples. Moreover, such interconnections can be routed in different metallization structure layers apart from the example shown in FIGS. 1 and 2. In these examples, the first and second plates 191, 192 are directly connected to the conductive metal contacts 160 of the source region 110 and the drain region 112 located in a contact-level metal layer (e.g., the PMD layer 154).

FIGS. 3 and 4 show top views of the IC 100 respectively taken along lines 3-3 and 4-4 of FIG. 1. In this example, the vias 183 of the first and second plates 191 and 192 extend generally parallel to the finger direction (e.g., the Y direction, generally parallel to the gate electrode structures 132 of the transistor 101) of the transistor 101. In addition, the plates 191, 192 in the examples of FIGS. 1-4 include an overlapping portion that is located over the gate electrode 132. In other words the gate electrode 132 in the left side of the figure is located between the capacitor portion 180 and the substrate 102, and the gate electrode 132 in the right side of the figure is located between the capacitor portion 181 and the substrate 102, FIGS. 3 and 4 also show metallization routing features or plugs connected to the gate electrode 132 at the end of the illustrated transistor finger structure.

Figure 5:
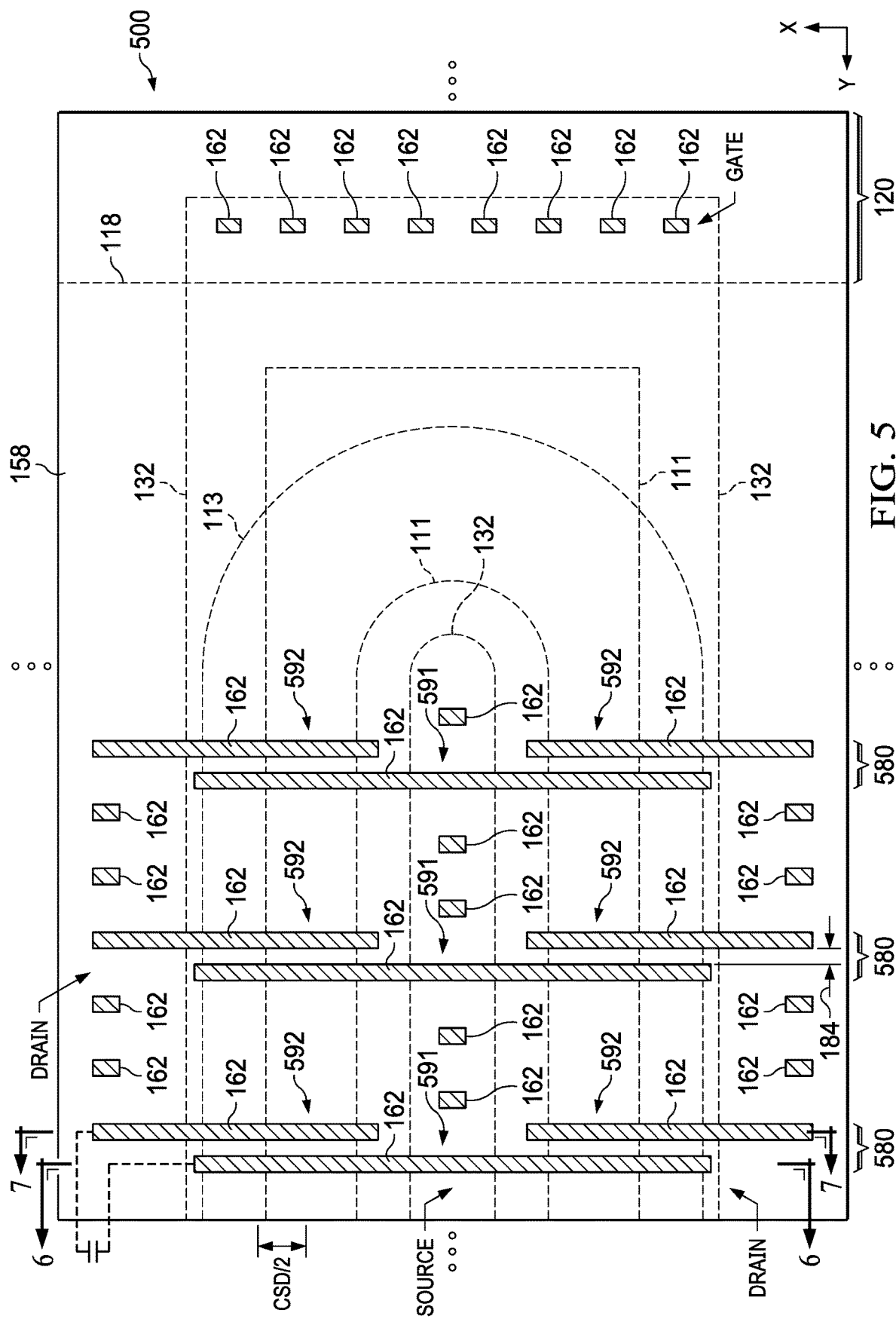
FIG. 5 is a partial sectional top plan view along line 5-5 of FIGS. 6 and 7 of another example integrated circuit including a drain-extended transistor and an integrated drain-source capacitor with capacitor interconnect structures extending in a first metallization layer perpendicular to the transistor finger direction.
Figure 6:
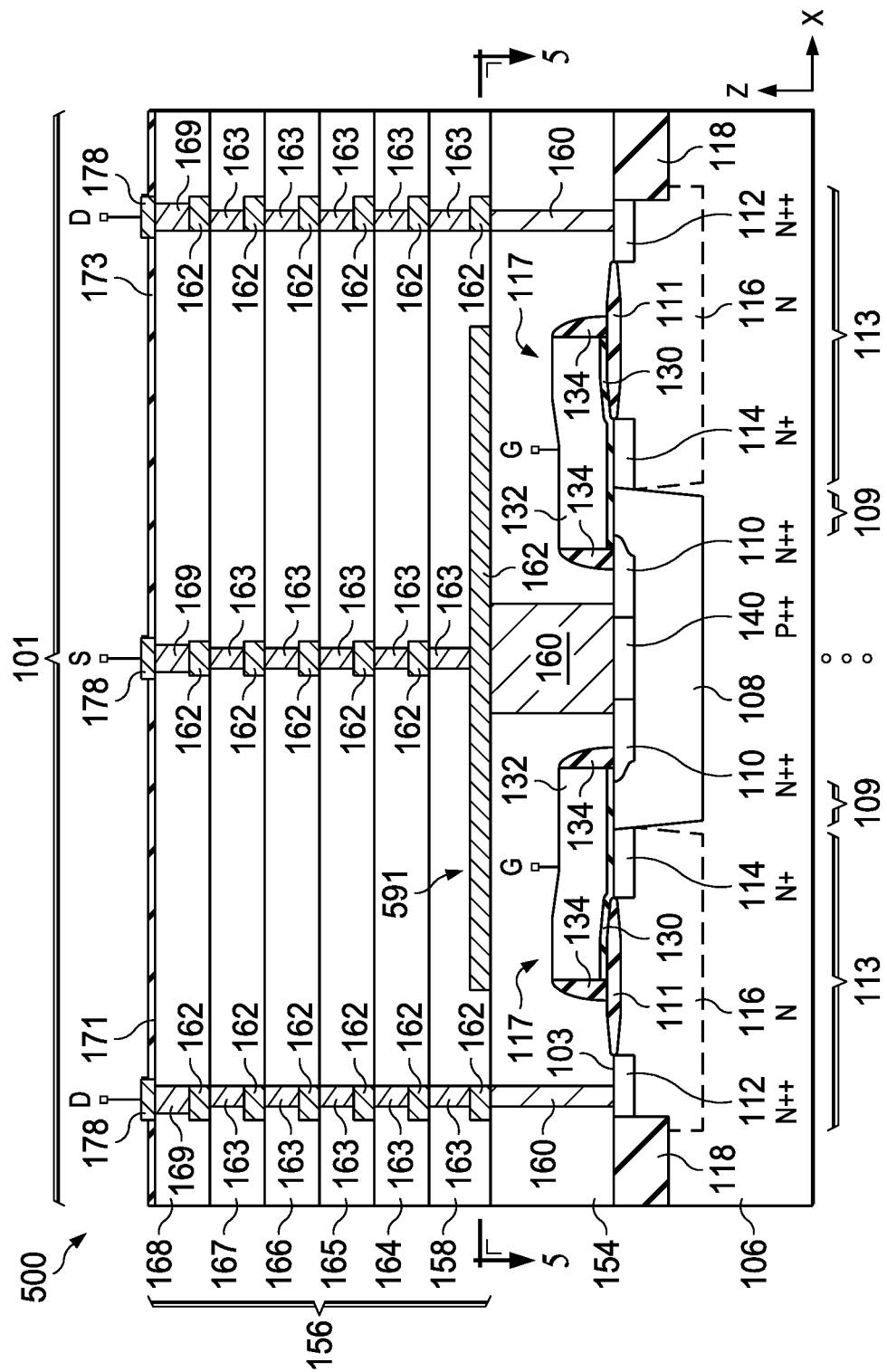
FIG. 6 is a partial sectional side elevation view of an example capacitor interconnect structure connected to the transistor source in the integrated circuit along line 6-6 of FIG. 5.
Figure 7:
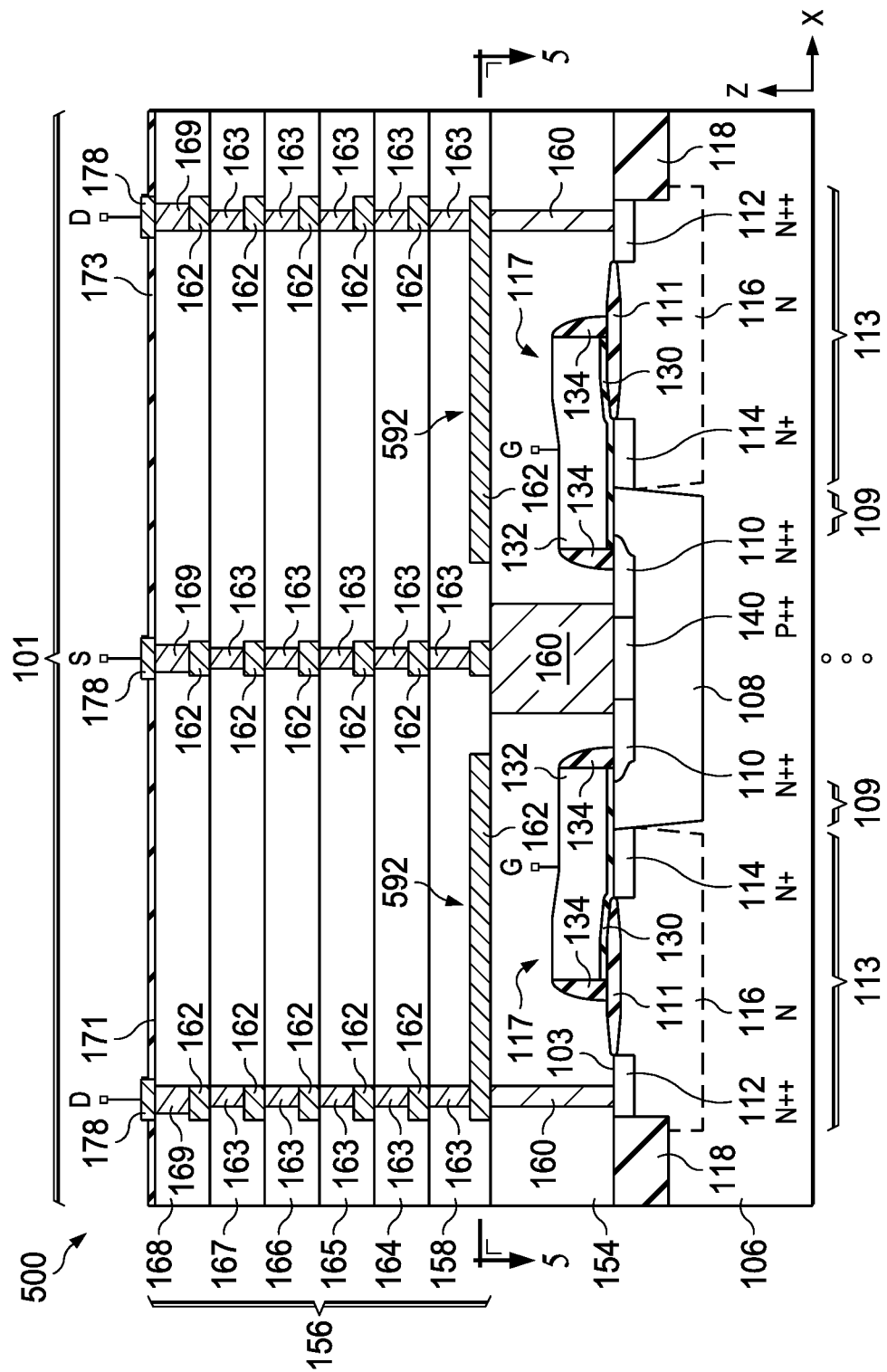
FIG. 7 is a partial sectional side elevation view of an example capacitor interconnect structure connected to the transistor drain in the integrated circuit along line 7-7 of FIG. 5.

FIGS. 5-7 show another example IC 500 with a drain-extended transistor 101 as described above, and an integrated drain-source capacitor 580 having plates 591 and 592. FIG. 5 shows a top view of the IC 500, FIG. 6 shows a partial sectional side elevation view along line 6-6 in FIG. 5, and FIG. 7 shows a side view along line 7-7 in FIG. 5. In this example, the conductive features of the first and second plates 591, 592 are in the first ILD layer 158 that extends over the PMD layer 154. As shown in FIG. 5, the capacitor plates 591, 592 extend along the X axis in the first ILD layer 158, generally perpendicular to the transistor finger direction (e.g., the Y axis, generally perpendicular to the gate electrode structures 132 of the transistor 101). One example source-connected plate structure 591 is shown in the sectional side view of FIG. 6. The side view of FIG. 7 shows two example drain-connected plate structures 592 along line 7-7 in FIG. 5. In one example, the plates 191 and 192 of the integrated capacitor 580 in FIGS. 5-7 are formed using conductive line features 162 in the first ILD layer 158 (e.g., similar to FIG. 2 above). In another example, the plates 191 and 192 of the integrated capacitor in FIGS. 5-7 are formed using vias 163 or dummy tungsten plugs (not shown) in the ILD layer 185 that stop on the underlying metal layer or on the PMD dielectric 154 as shown in FIGS. 5-7. The mask used to etch openings for the tungsten vias 163 in the first ILD layer 158 is modified in one example to create these dummy plugs in a row sufficiently close to create a generally continuous plate structure 191 or 192 as shown in FIGS. 6 and 7. The routing in the first ILD layer 158 connects the corresponding plates 191 and 192 with a corresponding one of the source region 110 and the drain region 112.

The disclosed structures provide integrated capacitors with low inductance, and low equivalent series resistance (ESR). This is particularly beneficial compared with the use of external capacitors or other external's number circuit components, since the integration of the capacitor 180, 181 in the IC 100, 500 reduces or mitigates inductance in the transistor circuit. This, in turn, facilitates enhanced power efficiency, higher power density and reduced cost through reduced bringing voltages and currents. For example, in operation as a high or low side switch of a switching power conversion circuit, the resulting transistor 101 can be switched at a higher operating frequency while still facilitating at or near zero voltage or zero current switching. In addition, since the integrated capacitor helps reduce the magnitude of any voltage or current ringing, and helps to reduce the overall settling time in response to switching transitions, the transistor 101 and associated source-drain capacitor facilitates faster switching and the associated benefits for cost, efficiency and power density.

Figure 8:
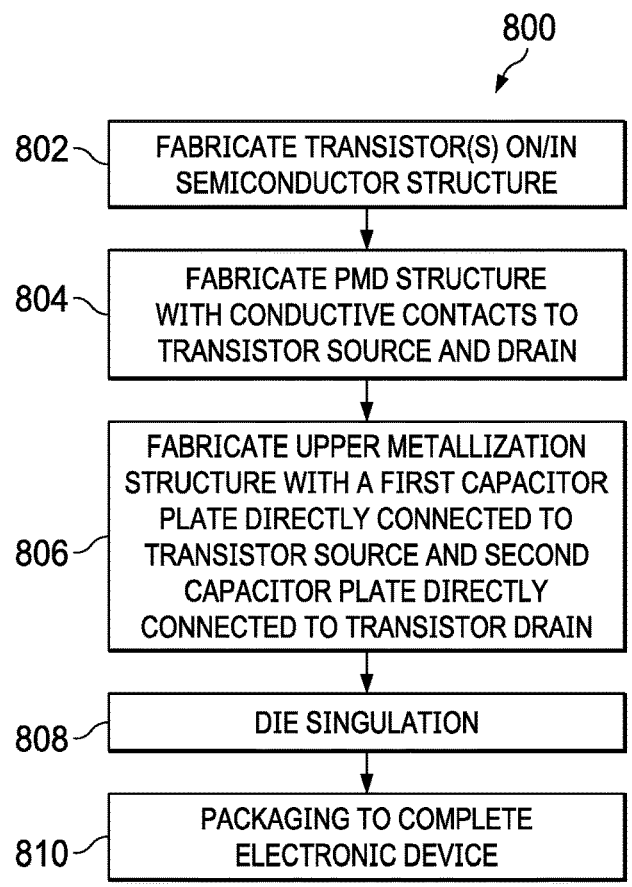
FIG. 8 is a flow diagram showing a method for making a drain-extended transistor with an integrated drain-source capacitor.

FIG. 8 shows a method 800 to fabricate an electronic device, such as an integrated circuit 100, 500 or standalone electronic device having a MOS transistor (e.g., a drain-extended transistor 101 as illustrated and described above). The method 800 includes fabricating one or more transistors on and/or in a semiconductor structure at 802. In one drain-extended transistor example, the transistor fabrication at 802 includes providing a semiconductor substrate 102 with a p-type layer 106 PBL that includes majority carrier dopants of a first type (e.g., P), forming an oxide structure 111 along a side (e.g., first side 103) of the substrate 102, and implanting dopants of a second type (e.g., N) into the semiconductor substrate 102 to form a drift region (e.g., drift region 113 above) that is at least partially under the oxide structure 111. The drain-extended fabrication example at 802 also includes implanting dopants of the first type (e.g., P) into the semiconductor substrate 102 to form a body region 108 having a channel portion 109 adjacent the drift region 113, forming a gate structure 117 over the channel portion 109 of the body region 108 and over a portion of the oxide structure 111, and forming a source region 110 and a drain region 112 by implanting dopants of the second type (N) adjacent the channel portion 109 of the body region 108, and adjacent the second drift region portion 116 and the oxide structure 111.

At 804, the method 800 includes fabricating a capacitor, such as the above-describe capacitor 180, 181. The capacitor fabrication includes 804 and 806. At 804 in one example the capacitor fabrication includes metallization structure, or interconnect, processing, for example to create the PMD layer 154 and contacts 160. The upper metal structure 156 is processed to form a first plate 191 connected directly to the transistor source region 110 and a second plate 192 connected directly to the transistor drain region 112. As shown in FIGS. 1-7, one example of the metallization structure fabrication at 804 includes fabricating a PMD layer (e.g., PMD layer 154 above) over the transistor 101, where the PMD layer 154 includes a conductive source contact 160 in contact with the source region 110, and a conductive drain contact 160 in contact with the drain region 112.

The method 800 continues at 806 with fabricating an upper metallization structure. In the above example, this includes fabricating the upper metallization structure 156 (e.g., the first ILD layer 158 and the metallization layers 164-167) in which are located the first plate 191 connected directly to the conductive source contact 160, and the second plate 192 connected directly to the conductive drain contact 160. The metallization fabrication at 806 in one example provides the second plate 192 spaced from the first plate 191 by a dielectric material of the upper metallization structure (e.g., one or more of the dielectric materials of the first ILD layer 158 and the metallization layers 164-167) to form a capacitor connected directly between the source region 110 and the drain region 112. In certain examples, the processing at 806 fabricates the plates 191, 192 in the upper metallization structure with an overlapping portion located over the gate of the transistor. In certain examples, as seen in FIGS. 1-4 above, the plates 191, 192 are fabricated in the upper metallization processing at 806 to extend parallel to the finger direction of the fabricated transistor. In other examples (e.g., FIGS. 5-7), plates 591, 592 are made to extend generally perpendicular to the transistor finger direction at 806. The method 800 further includes die separation or singulation at 808, and packaging at 810 to complete the IC 100, 500.

Figure 9:
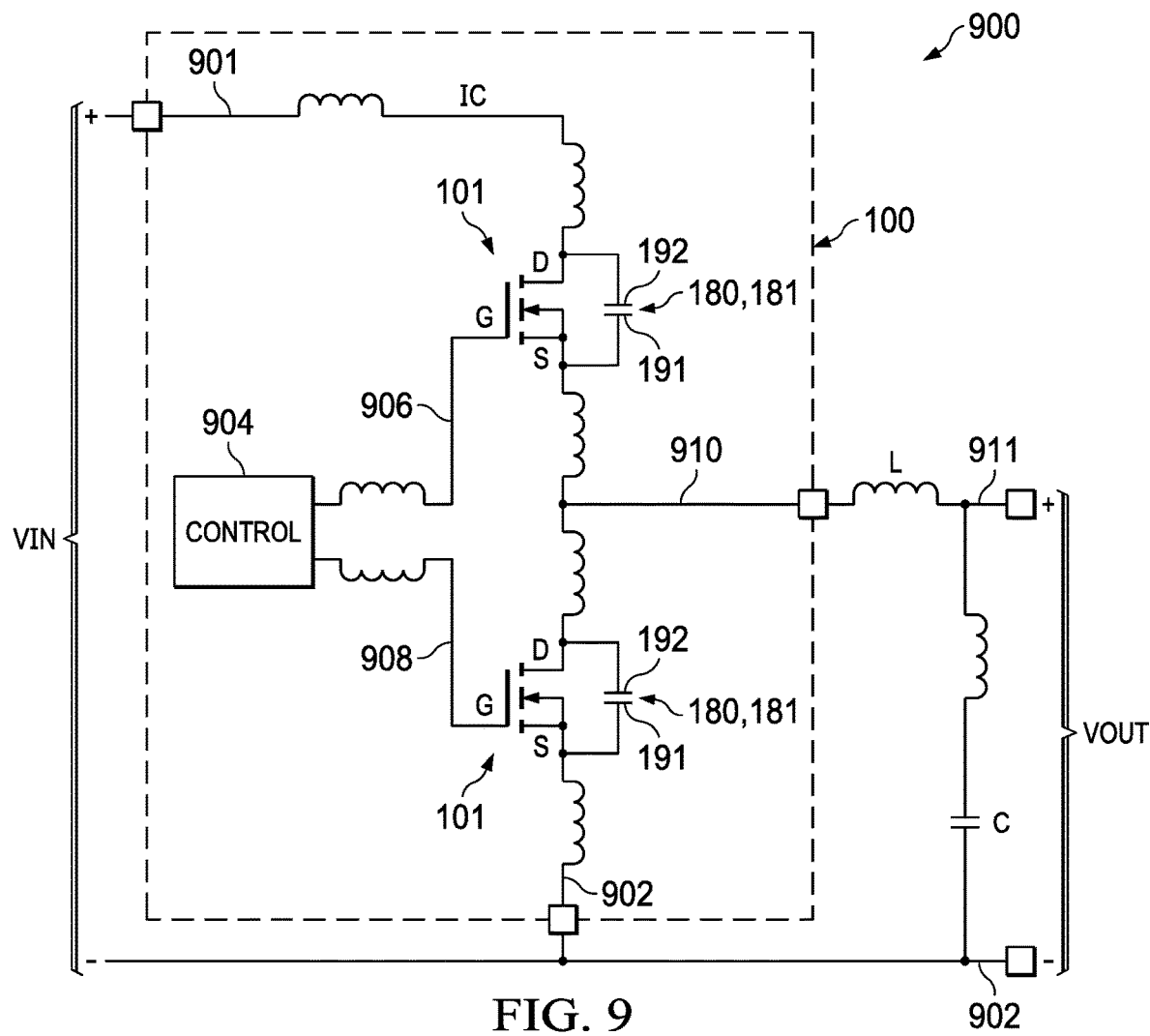
FIG. 9 is a schematic diagram of an integrated circuit that includes first and second transistors with integrated source-drain capacitors and a control circuit configured to implement a DC-DC switching power supply.

FIG. 9 shows an example switching buck DC-DC converter circuit 900 that includes an example of the above-described IC 100. In this example, the IC 100 is a DC-DC converter controller chip that includes drain extended NMOS transistors 101 as described above configured in a high side, low side configuration in series with one another between a first input terminal or node 901 and a second input terminal or node 902. In operation, the switching DC-DC converter receives an input signal, such as a DC input voltage VIN across the first and second input terminals 901, 902, and provides a DC output voltage signal VOUT through switching operation of the transistors 101. The IC 100 in this example includes a control circuit 904 that provides switching control signals to control terminals 906, 908 (e.g., gates) of the transistors 101 to turn the transistors on and off in alternating fashion to control a voltage of a switching node 910. The IC 100 also includes the integrated capacitors 180, 181 with first plates 191 connected directly to the source terminal of the associated transistor 101, and second plates 192 connected directly to the associated drain terminal. The converter circuit 900 also includes an output capacitor C connected between the output terminal 911 and the second input terminal 902. In one example, an output inductor L and the output capacitor C are external to the IC 100. In other implementations, one or both of these components are integrated in the IC 100. The schematic diagram in FIG. 9 also shows several stray or parasitic inductances in the circuitry.

Figure 10:
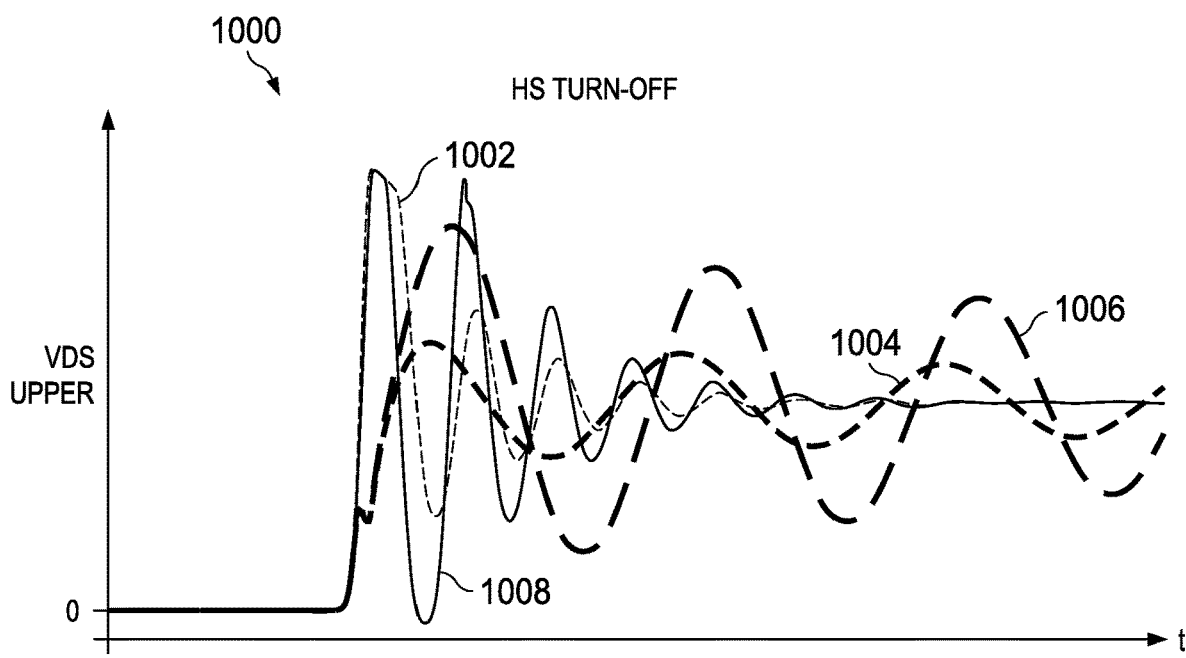
FIG. 10 is a signal diagram showing comparative high side switch voltage curves for a high side switch turn-off condition in a buck converter circuit.

Referring also to FIGS. 10-14, integration of the capacitors 180, 181 in the IC 100 advantageously mitigates or avoids the need for external snubber circuitry connected to the transistors 101, while mitigating or controlling ringing to facilitate high-frequency switching operation of the transistors 101. FIGS. 10-14 include simulated voltage and current signal curves to show the effect of the integrated source-drain capacitors 180, 181 in the example buck converter circuit 900 of FIG. 9. A graph 1000 in FIG. 10 shows comparative high side switch voltage curves (drain-source voltage VDS of the upper transistor 101 in FIG. 9). The graph includes high side VDS curves 1002, 1004, 1006 and 1008 for a high side switch turn-off condition in the example buck converter circuit 900 of FIG. 9. The curve 1002 shows the high side transistor VDS for no integrated capacitors. The curve 1004 shows the high side VDS for the described example where both the high and low side transistors 101 include integrated drain-source capacitors 180, 181. The curve 1006 shows the high side VDS for the case where only the high side transistor 101 has an integrated drain-source capacitor 180, 181, and the curve 1008 shows the high side VDS where only the low side transistor 101 has an integrated drain-source capacitor 180, 181. The curves 1002, 1004, 1006 and 1008 show benefits or providing one or more integrated capacitors 180, 181 shortens settling time and reduces peak amplitude in the high side switch VDS voltage following a high side switch turn-off. The integrated capacitor or capacitors facilitate ZVS and/or ZCS operation with shorter waiting times following a high side switch turn-off.

Figure 11:
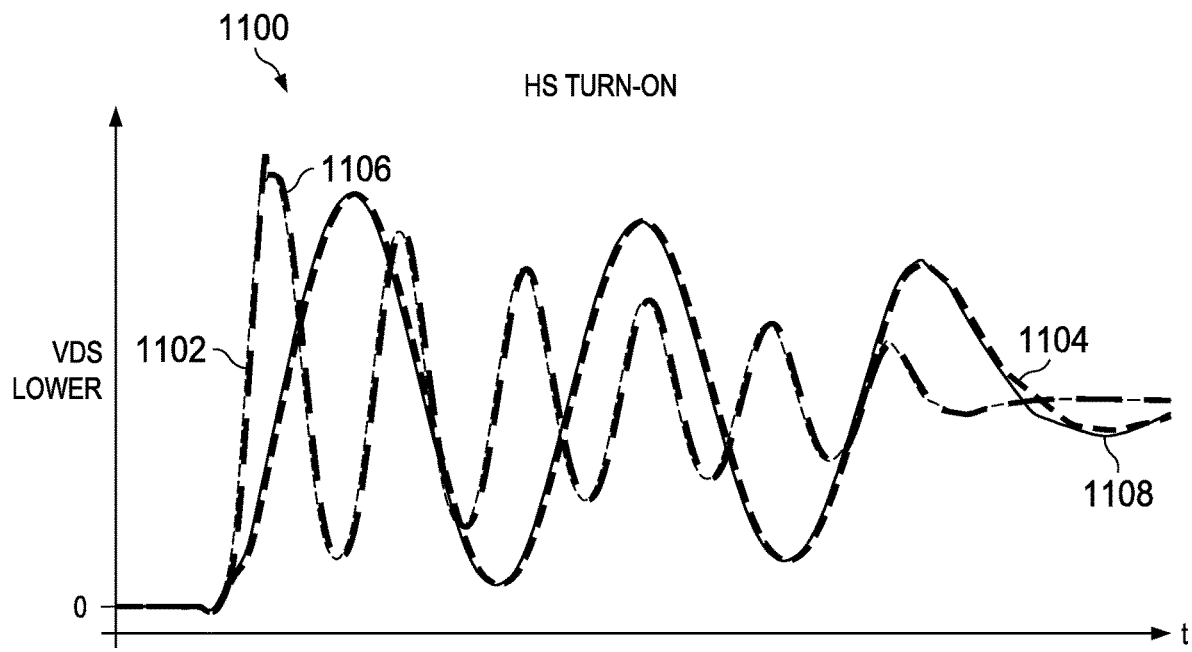
FIG. 11 is a signal diagram showing comparative low side switch voltage curves for a high side switch turn-off condition in the buck converter circuit.

FIG. 11 provides a graph 1100 showing low side VDS curves 1102, 1104, 1106 and 1108 for the high side switch turn-off condition in the example buck converter 900. The curve 1102 shows the low side transistor VDS for no integrated capacitors after the high side switch is turned off. Significant improvement is seen in the curve 1104, which shows the low side VDS for which both the high and low side transistors 101 include integrated drain-source capacitors 180, 181. The curve 1106 in FIG. 11 shows the low side VDS for the high side switch turn-off condition where only the high side transistor 101 has an integrated drain-source capacitor 180, 181. The curve 1108 shows the low side VDS where only the low side transistor 101 has an integrated drain-source capacitor 180, 181. The curves 1104 and 1108 with the integrated capacitors slow the ringing frequency compared to the low side voltage curves 1102 and 1106 with no integrated capacitors.

Figure 12:
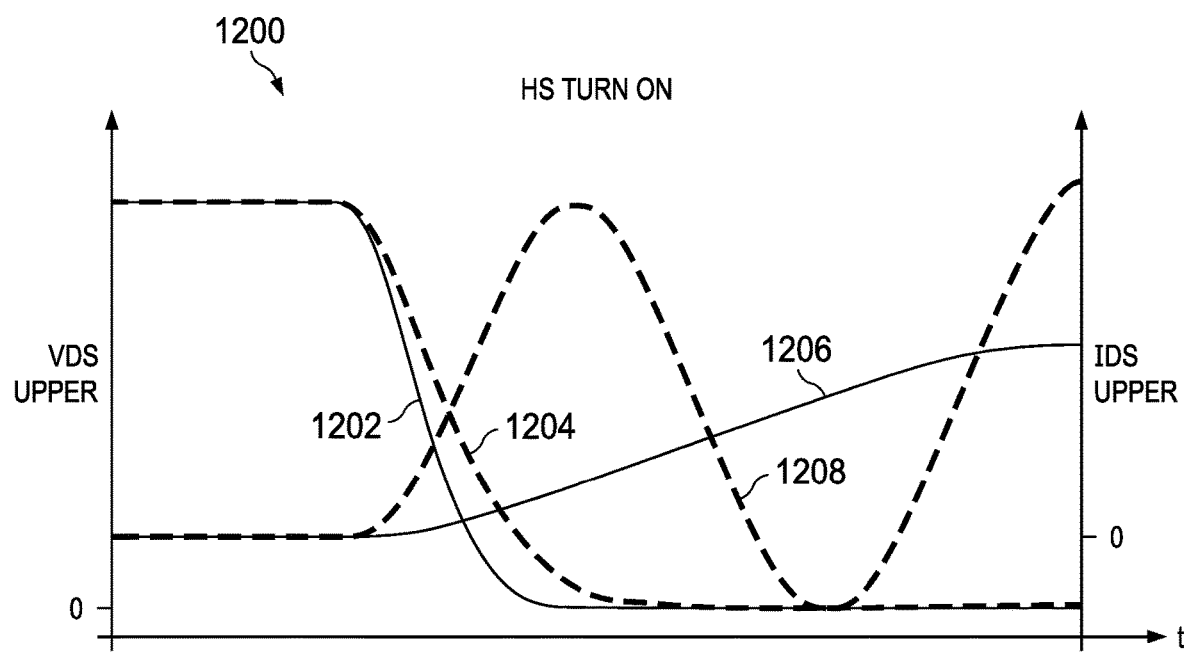
FIG. 12 is a signal diagram showing comparative high side switch voltage and current curves for a high side switch turn-on condition in the buck converter circuit.

A graph 1200 in FIG. 12 shows example high side switch voltage curves 1202 and 1204, and high side switch current curves 1206 and 1208, for a high side switch turn-on condition in the buck converter circuit 900. The curve 1202 shows the high side transistor drain-source voltage VDS for the case of no integrated capacitors, and the curve 1204 shows the high side VDS for the case where both the high and low side transistors 101 include integrated drain-source capacitors 180, 181. The curve 1206 shows the high side drain-source current IDS for a high side switch turn-on condition with no integrated capacitors, and the curve 1208 shows the high side drain-source current IDS for a high side switch turn-on condition where both the high and low side transistors 101 include integrated drain-source capacitors 180, 181. The high side VDS is damped by the provision of the integrated capacitors to the converter switches, where the voltage curve 1204 with integrated capacitors responds slower to the turn-on condition than in the curve 1202 with no integrated capacitors.

Figure 13:
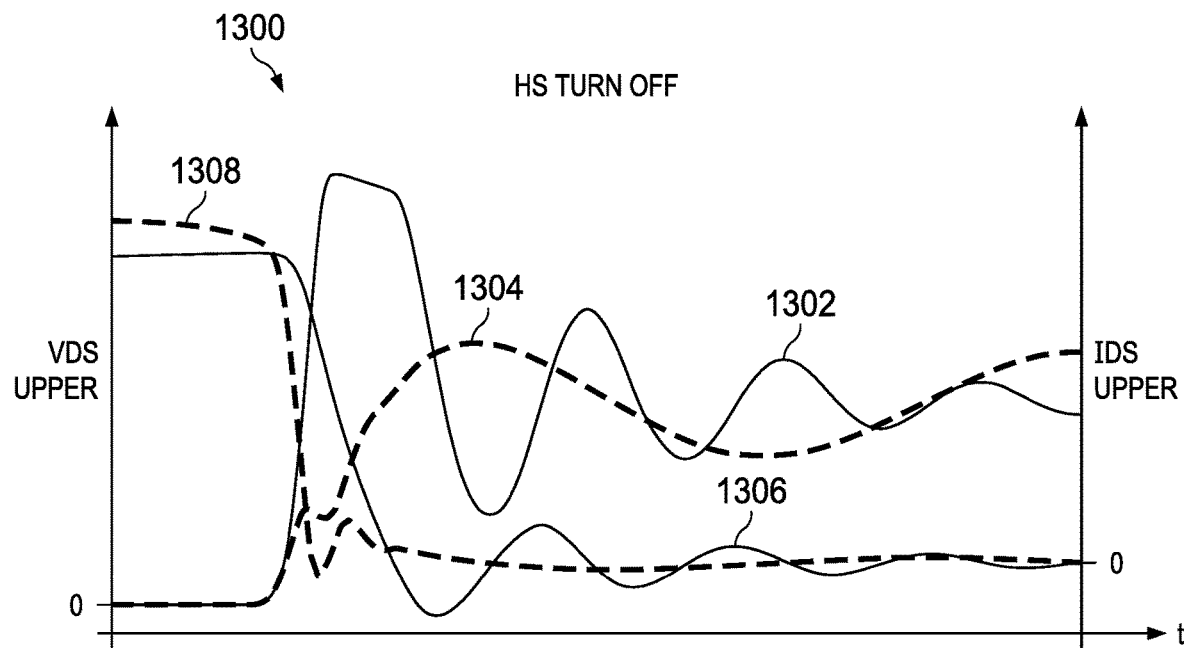
FIG. 13 is a signal diagram showing comparative high side switch voltage and current curves for a high side switch turn-off condition in the buck converter circuit.

FIG. 13 shows a graph 1300 with voltage curves 1302 and 1304, and current curves 1306 and 1308, for the buck converter high side switch turn-off condition. The curve 1302 in FIG. 13 shows the high side VDS for the case of no integrated capacitors, and the curve 1304 shows the high side VDS for the case that both the high and low side transistors 101 include integrated drain-source capacitors 180, 181 in response to the high side switch turning off. The curve 1306 shows the high side drain-source current IDS with no integrated capacitors, and the curve 1308 shows the high side current IDS for a high side switch turn-off condition where both the high and low side transistors 101 include integrated drain-source capacitors 180, 181. The high side device curves 1304 and 1308 with the integrated capacitors slow the ringing frequency and lower the current amplitude compared to the curves 1302 and 1306 with no integrated capacitors.

Figure 14:
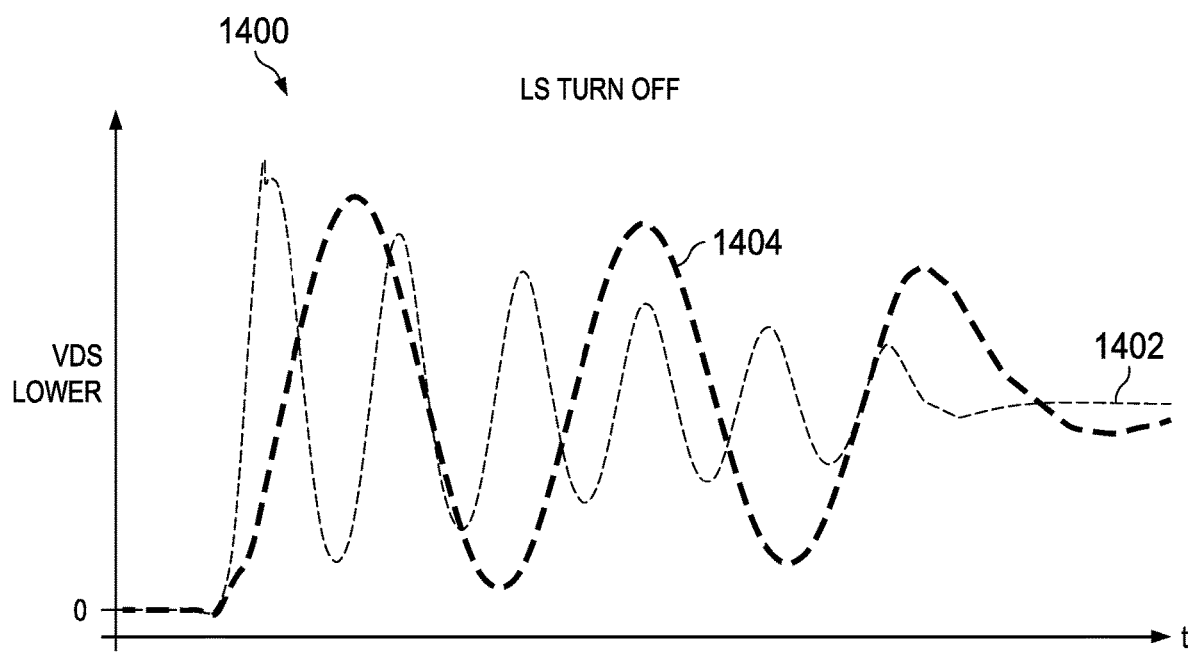
FIG. 14 is a signal diagram showing comparative low side switch voltage curves for a low side switch turn-off condition in the buck converter circuit.

FIG. 14 provides a graph 1400 that shows comparative low side switch voltage curves 1402 and 1404 for a low side switch turn-off condition in the buck converter circuit. The curve 1402 shows the drain-source voltage VDS of the low side switch where neither switch has an integrated capacitor. The curve 1404 shows the low side VDS where both the high and low side transistors 101 include integrated drain-source capacitors 180, 181 for a low side switch turn-off condition. The low side turn off voltage performance is also improved by the integrated capacitors, where the curve 1404 slows the ringing frequency compared to the curve 1402 with no integrated capacitors.

Figure 15:
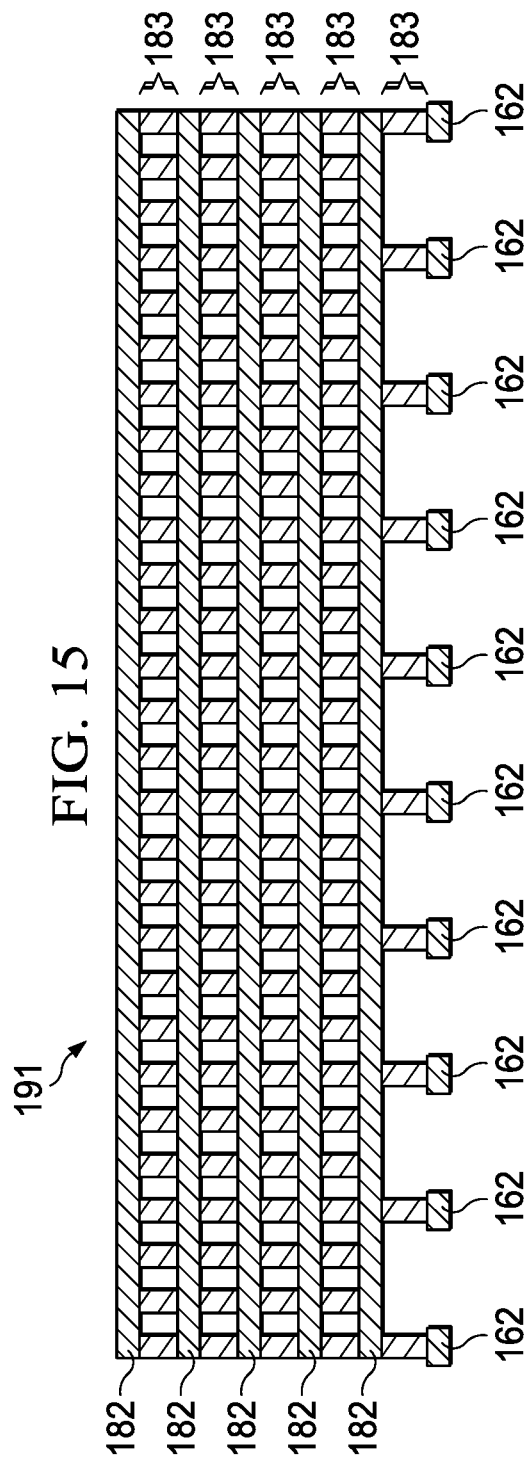
FIG. 15 is a partial sectional side elevation view of an example capacitor interconnect structure taken along line 15-15 of the integrated circuit of FIG. 3.

FIG. 15 illustrates an example implementation of a capacitor plate formed by interconnect structures, e.g. the plate 191 or 192. In this example, five line segments 182 are each connected to a neighboring line segment by a row of vias 183. The vias 183 in the rows may be spaced as close together as manufacturing design rules allow to maximize capacitive coupling between the plates 191, 192. In one example, the vias 183 touch one another to form electrical connection, although not required of all possible implementations. For example, the vias 183 can be merged in groups to form general rectangular conductive via structures or trench via structures. A bottommost line segment 182 is connected to line segments 162 by additional vias 183. The line segments 162 are in turn connected to one of the source region 110 or the drain region 112.

Modifications are possible in the described embodiments, and other embodiments are possible, within the scope of the claims.

The invention claimed is:

1. An electronic device, comprising:
   a transistor having a gate electrode between a source region and a drain region;
   a first interconnect structure conductively connected to the source region, the first interconnect structure located in a metallization layer and having a first horizontal member overlying the source region and the gate electrode, the first horizontal member conductively connected to a metal line or a plurality of metal vias located directly over and running parallel to the gate electrode, and the first horizontal member connected to a source terminal that extends from the first horizontal member toward an upper side of the metallization layer; and
   a second interconnect structure conductively connected to the drain region, the second interconnect structure located in the metallization layer and having a second horizontal member overlying the drain region and the gate electrode, the second horizontal member conductively connected to a metal line or a plurality of metal vias located directly over and running parallel to the gate electrode, and the second horizontal member connected to a drain terminal that extends from the second horizontal member toward the upper side of the metallization layer.

2. The electronic device of claim 1,
   wherein the first interconnect structure includes a first plurality of metal lines located over the gate electrode, the first plurality of metal lines being connected by metal vias; and
   wherein the second interconnect structure includes a second plurality of metal lines located over the gate electrode, the second plurality of metal lines being connected by metal vias.

3. The electronic device of claim 1, wherein the first and second interconnect structures include copper, aluminum, or tungsten.

4. The electronic device of claim 1, wherein the metallization layer that includes the conductive features of the first and second interconnect structures is a first metallization layer that extends over a pre-metal dielectric layer of the MOS transistor.

5. The electronic device of claim 1, wherein the first interconnect structure includes conductive features in a plurality of metallization layers of the MOS transistor, and wherein the second interconnect structure includes conductive features in the plurality of metallization layers.

6. The electronic device of claim 5, wherein the the first and second members are located directly on a pre-metal dielectric layer of the MOS transistor.

7. The electronic device of claim 1, wherein the first interconnect structure includes conductive features in a plurality of metallization layers of the MOS transistor, and wherein the second interconnect structure includes conductive features in the plurality of metallization layers.

8. The electronic device of claim 7, wherein the metallization layers that include the conductive features of the first and second interconnect structures extend directly on a pre-metal dielectric layer of the MOS transistor.

9. The electronic device of claim 7, wherein the first and second interconnect structures include copper, aluminum, or tungsten.

10. The electronic device of claim 1, wherein the first and second interconnect structures for two plates of a parallel plate capacitor.

11. An electronic device, comprising:
    a transistor having a gate electrode between a source region and a drain region;
    a first interconnect structure conductively connected to the source region, the first interconnect structure located in a metallization layer and having a first horizontal member overlying the source region and the gate electrode, the first horizontal member conductively connected to a metal line or a plurality of metal vias located directly over and running perpendicular to the gate electrode, and the first horizontal member connected to a source terminal that extends from the first horizontal member toward an upper side of the metallization layer; and
    a second interconnect structure conductively connected to the drain region, the first interconnect structure located in the metallization layer and having a second horizontal member overlying the drain region and the gate electrode, the second horizontal member conductively connected to a metal line or a plurality of metal vias located directly over and running perpendicular to the gate electrode, the second interconnect structure running parallel to the first interconnect structure, and the second horizontal member connected to a drain terminal that extends from the second horizontal member toward the upper side of the metallization layer.

12. The electronic device of claim 11,
    wherein the first interconnect structure includes a first plurality of metal lines located over the gate electrode, the first plurality of metal lines being connected by metal vias; and wherein the second interconnect structure includes a second plurality of metal lines located over the gate electrode, the second plurality of metal lines being connected by metal vias.

13. The electronic device of claim 11, wherein the first and second interconnect structures include copper, aluminum, or tungsten.

14. The electronic device of claim 11, wherein the first and second horizontal members are located directly on a pre-metal dielectric layer of the MOS transistor.

15. The electronic device of claim 11, wherein the first interconnect structure includes conductive features in a plurality of metallization layers of the MOS transistor, and wherein the second interconnect structure includes conductive features in the plurality of metallization layers.

16. The electronic device of claim 15, wherein the first and second horizontal members are located directly on a pre-metal dielectric layer of the MO S transistor.

17. The electronic device of claim 11, wherein the first interconnect structure includes conductive features in a plurality of metallization layers of the MOS transistor, and wherein the second interconnect structure includes conductive features in the plurality of metallization layers.

18. The electronic device of claim 17, wherein the first and second interconnect structures include copper, aluminum, or tungsten.

19. The electronic device of claim 11, wherein the first and second horizontal members overlap two sides of the gate electrode.

20. An integrated circuit, comprising:
a transistor having a gate electrode between a source region and a drain region;
an integrated capacitor connected between the source region and the drain region, the integrated capacitor including a first interconnect structure connected to the drain region and spaced apart from a second interconnect structure connected to the drain region,
the first interconnect structure located in a metallization layer and having a first horizontal member overlying the source region and the gate electrode, the first horizontal member conductively connected to a metal line or a plurality of metal vias located over and running parallel to the gate electrode, and connected to a source terminal that extends from the first horizontal member toward an upper side of the metallization layer; and
the second interconnect structure located in the metallization layer and having a second horizontal member overlying the drain region and the gate electrode, the second horizontal member conductively connected to a metal line or a plurality of metal vias located over and running parallel to the gate electrode, the second interconnect structure running parallel to the first interconnect structure and connected to a drain terminal that extends from the second horizontal member toward the upper side of the metallization layer.

21. An integrated circuit, comprising:
a transistor having a gate electrode between a source region and a drain region;
a first interconnect structure conductively connected to the source region, the first interconnect structure located in a metallization layer and having a first horizontal member overlying the source region and the gate electrode, the first horizontal member conductively connected to a metal line or a plurality of metal vias located over and running perpendicular to the gate electrode, and connected to a source terminal that extends from the horizontal member toward an upper side of the metallization layer; and
a second interconnect structure conductively connected to the drain region, the second interconnect structure located in the metallization layer and having a second horizontal member overlying the drain region and the gate electrode, the second horizontal member conductively connected to a metal line or a plurality of metal vias located over and running perpendicular to the gate electrode, the second interconnect structure running parallel to the first interconnect structure and connected to a drain terminal that extends from the horizontal member toward the upper side of the metallization layer.

22. The electronic device of claim 21, wherein the first and second horizontal members overlap two sides of the gate electrode.

* * * * *